(12) United States Patent
Fung

(10) Patent No.: US 6,642,579 B2
(45) Date of Patent: Nov. 4, 2003

(54) METHOD OF REDUCING THE EXTRINSIC BODY RESISTANCE IN A SILICON-ON-INSULATOR BODY CONTACTED MOSFET

(75) Inventor: Ka Hing Fung, Fishkill, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/940,297

(22) Filed: Aug. 28, 2001

(65) Prior Publication Data
US 2003/0052347 A1 Mar. 20, 2003

(51) Int. Cl.[7] .................. H01L 27/01; H01L 27/12; H01L 31/0392
(52) U.S. Cl. ..................................... 257/347
(58) Field of Search .................. 257/288, 347–354, 257/344, 504, 219, 345, 607; 438/142

(56) References Cited

U.S. PATENT DOCUMENTS

| | | | | |
|---|---|---|---|---|
| 4,752,817 A | * | 6/1988 | Lechaton et al. | 357/34 |
| 5,185,280 A | | 2/1993 | Houston et al. | 437/44 |
| 5,405,795 A | * | 4/1995 | Beyer et al. | 437/41 |
| H1435 H | * | 5/1995 | Cherne et al. | 257/347 |
| 5,541,432 A | * | 7/1996 | Tsuji | 257/350 |
| 5,573,961 A | | 11/1996 | Hsu et al. | 437/21 |
| 5,637,899 A | * | 6/1997 | Eimori et al. | 257/347 |
| 5,652,454 A | | 7/1997 | Iwamatsu et al. | 257/350 |
| 5,767,549 A | | 6/1998 | Chen et al. | 257/347 |
| 5,780,327 A | * | 7/1998 | Chu et al. | 438/156 |
| 5,818,085 A | * | 10/1998 | Hsu et al. | 257/347 |
| 5,821,575 A | * | 10/1998 | Mistry et al. | 257/281 |
| 5,920,093 A | * | 7/1999 | Huang et al. | 257/347 |
| 5,962,895 A | * | 10/1999 | Beyer et al. | 257/347 |
| 5,965,917 A | * | 10/1999 | Maszara et al. | 257/347 |
| 5,973,364 A | * | 10/1999 | Kawanaka | 257/347 |
| 6,100,153 A | * | 8/2000 | Nowak et al. | 438/382 |
| 6,121,666 A | * | 9/2000 | Burr | 257/408 |
| 6,156,589 A | | 12/2000 | Noble | 438/149 |
| 6,177,708 B1 | | 1/2001 | Kuang et al. | 257/347 |
| 6,191,449 B1 | * | 2/2001 | Shino | 257/347 |
| 6,303,961 B1 | * | 10/2001 | Shibib | 257/335 |
| 6,307,237 B1 | * | 10/2001 | Erstad | 257/401 |
| 6,483,171 B1 | * | 11/2002 | Forbes et al. | 257/627 |

* cited by examiner

Primary Examiner—Amir Zarabian
(74) Attorney, Agent, or Firm—H. Daniel Schnurmann

(57) ABSTRACT

As the silicon-on-insulator field effect transistor (SOI FET) CMOS technology continues migrating towards thinner SOI thicknesses to reduce the parasitic capacitance and improve the short channel effects, it is known that the body resistance of body contacted MOSFETs increases correspondingly. The problem is compounded for strong halo and weak wells device designs for T-shaped or L-shaped BC-MOSFETs. The invention provides a structure and a method that includes an additional well level implant for n-type and p-type devices in selected parts of the extended gate region. A new mask increases the channel doping at the extended gate region to prevent that region from fully depleting and increasing the carrier concentration for lower resistance. Since the physical gate dimensions are usually narrower than the mask dimensions, the mask is slightly offset from the extended gate edge to avoid excessive encroachment into the intrinsic device channel region. The SOI FET includes: a pattern having a first extended region to form a gate for the SOI FET, and a second extended region to isolate the body contact region from the SOI FET; a first sub-region under the first extended region having added doping to adjust the threshold voltage of the SOI FET, the first sub-region defining a gate width of the SOI FET; a second sub-region under the second extended region and an adjoining portion of the first extended gate region to form a low resistance extrinsic body contact region; source and drain regions respectively positioned at each side of the first extended region; and a body contact region adjacent to the second extended region opposite to the SOI FET.

11 Claims, 8 Drawing Sheets

METHOD OF REDUCING THE EXTRINSIC BODY RESISTANCE IN A SILICON-ON-INSULATOR BODY CONTACTED MOSFET

FIELD OF THE INVENTION

This invention is generally related to silicon-on-insulator (SOI) CMOS devices, and more particularly, to a method for reducing the body resistance in a body contacted MOSFET (BC-MOSFET) device to avoid a floating body effect.

BACKGROUND OF THE INVENTION

SOI CMOS has become the mainstream technology for high performance microprocessor applications. This technology continues migrating towards thinner SOI thicknesses to further reduce the parasitic capacitance and improve the short channel effect. A significant obstacle to thinner SOI films is that the body resistance increases drastically. A low body resistance is essential for SOI CMOS technology because many circuit applications require the use of a body contacted MOSFET (BC-MOSFET) to avoid the floating body effect. This invention is intended to solve the problem of body resistance in SOI films thinner than 100 nm without complicating the process.

Many patents exist that are related to solving the problem of the extrinsic body resistance in SOI, all of which use a complex process to form the body contact. As a result, the added processing makes the patents inappropriate for conventional SOI CMOS technologies. By way of example, U.S. Pat. No. 5,962,895 describes an SOI transistor having a self-aligned body contact that uses a complex method of inserting a body contact next to the source. The SOI transistor has a self-aligned body contact formed through an extension to the gate, which makes it possible to form the body contact with a minimal increase in area and avoids the need to connect the source to the body, as conventional schemes require, and more particularly, of having the body contact pass through the source. The body contact aperture is formed by raising the source and drain to define an initial aperture. A conformal layer is then deposited that is subsequently etched to create aperture-defining sidewalls. The contact aperture is etched next to define sidewall members that support the insulating sidewalls and segregate the collecting electrode from the gate, source and drain. Since the raised source drain process is highly complex, this method cannot be used for a conventional SOI technology.

U.S. Pat. No. 6,156,589 describes a compact SOI body contact link, the result of a complex method of inserting a body contact using epitaxial growth of the substrate at the device edge. The body contact is formed epitaxially from the substrate to the body region of the device. The body contact is self-aligned with the gate and is buried within the isolation region outside the active area of the device. Thus, the body contact does not increase the parasitic capacitance within the device, nor does the body contact affect the device density. No additional metal wiring or contact holes are required. Again, epitaxial growth is too complex to be used for SOI.

U.S. Pat. No. 5,767,549 describes an SOI CMOS structure incorporating a substrate, a layer of insulation, a layer of silicon having raised mesas and thin regions therebetween to provide ohmic conduction between the mesas, between the electronic devices on the mesas and interconnecting wires. This invention overcomes the problem of the floating gate due to an accumulation of charge below the channel of the MOSFET. Thus, a modified MESA isolation allows for two devices to share the same body contact. However, the MESA does not reach the BOX and, as such, it shares the bottom silicon for the body contact link. This method requires a modified MESA isolation and epitaxial growth process which is again too complex for conventional SOI devices.

U.S. Pat. No. 6,177,708 describes another SOI FET body contact structure wherein a self-aligned SOI FET device with an "L" shaped gate structure allows an integral diode junction to be formed between the source and the body of the device. Two devices having the same gate geometry are placed side-by-side in a single silicon island opening that accommodates but a single device and a "T" shaped gate structure. The devices, in accordance with this invention, are formed using standard SOI processing steps. An aspect of this invention includes the use of novel SOI devices with their body and source connected to each other for a variety of circuit applications, e.g., memory cell sense amplifiers and the like, where high speed operation necessitates the use of SOI technology, but where physical space considerations limit their application. This patent is limited to an L-shaped body contact, and being one of the first ones to make use of an L-shaped body contact MOSFET, it is characterized by a high extrinsic body resistance in an ultra-thin film SOI environment.

U.S. Pat. No. 5,405,795 describes a method of forming an SOI transistor having a self-aligned body contact. The body contact is formed through an extension to the gate such that the body contact introduces a minimal increase in area and avoids connecting the source to the body, as characteristic of conventional constructions that require passing the body contact through the source. The body contact aperture is formed by raising the source and drain to define an initial aperture, depositing a conformal layer that is etched to create aperture-defining sidewalls and etching the contact aperture using the sidewalls to define sidewall members that support the insulating sidewalls to isolate the collecting electrode from both the gate and source/drain. This patent is limited to T-shape structures and requires a highly complex raised source/drain process too complicated for use in a conventional SOI technology U.S. Pat. No. 5,965,917 describes a method of forming body contacts in SOI MOSFETs to eliminate floating body effects. The SOI MOSFET includes a silicon layer and an insulator layer positioned over a silicon substrate. The isolation region defines a silicon region positioned over the insulation layer. The silicon region further includes a source region, a drain region, and a doped body region. A first metal conductor is electrically coupled to the side and top of the source region and the side of the body region. The first metal conductor establishes a potential at the body region to control the floating body effect. A second metal conductor is electrically coupled to the top of the drain region. Herein, the source/drain do not reach the buried oxide (BOX). The metal straps the edge at the source side to short the source to the body. This structure precludes that the source and drain extend to the bottom of the SOI film. However, in today's commercial SOI technologies, the source and drain diffusion always extend to the BOX to minimize the parasitic junction capacitance.

U.S. Pat. No. 5,652,454 describes a semiconductor device on an SOI substrate. A field oxide film is formed to cover a surface of the SOI layer and reach the surface of the buried oxide film. As a result, a PMOS active region of the SOI and an NMOS active region of the SOI can be totally electrically isolated, preventing a latch-up. As a result, it is possible to provide a device on an SOI substrate which can implement a high level of integration by eliminating the reduction of the breakdown voltage between the source and drain, known to be a problem for conventional SOI field effect transistors (FETs). It further disposes the body contact region very efficiently, which hampers high integration and its method of manufacturing. NFETs and PFETs are completely isolated but by a deep STI/LOCOS. The source and drain do not touch the BOX. Thus, the body contact can easily be constructed. Again this structure requires that the source/drain not extend to the bottom of SOI film which increases significantly the parasitic junction capacitance.

U.S. Pat. No. 5,185,280 describes a method of fabricating an SOI MOSFET with pocket implant and body-to-source (BTS) contact. The transistor has an implanted region having the same conductivity type as the body underneath. The back gate threshold voltage is enhanced to reduce the possibility of back gate current flowing. In addition to the pocket implants and body contact, any floating body effects are minimized. Due to the BTS contact being located as far into the source as the pocket implant allows, negligible impact is made to the device channel. An ohmic connection between the source and the body is established by way of silicidation. The body is shorted to the source using a p+ implant at the extended drain region. This structure requires that the p+ implant align precisely with the source, and further requires that the source diffusion not touch the BOX. Again, this increases the parasitic capacitance substantially.

In two similar patents, U.S. Pat. No. 5,818,085 and U.S. Pat. No. 5,573,961 a body contact for a MOSFET device is fabricated in an SOI layer. The device structure features a heavily doped p-type body contact region in a lightly doped source and drain region of the MOSFET device, formed from an ion implantation through a metal silicide layer. The addition of the body contact results in more controllable device characteristics, in terms of drain currents and the like, than for counterparts fabricated in silicon on insulator layer, without the use of a body contact. This patent suffers from the same drawbacks as the previously mentioned U.S. Pat. No. 5,185,280, although the process sequence is slightly different.

The body resistance can be divided in two parts: the intrinsic resistance and the extrinsic body resistance. The present invention mainly addresses the problem of the extrinsic body resistance. FIG. 1 shows a layout of a conventional T-shaped BC-MOSFET. The portion of the gate that forms the transistor is shown by numeral 110, while the source and drain regions are respectively referenced by numerals 120 and 130. N-type doping of the source and drain are used for an NMOSFET device. The body contact having a p-type doping for an NMOSFET is represented by numeral 150. The extended gate region 140 separates the n-type doping of the source and drain from the p-type doping 150 of the NMOSFET.

The resistance under gate region A (110) is referred to the intrinsic portion (Rbint) because the resistance depends on the channel length Lg and channel width Weff (width of region A). There is essentially no control on Rbint because the doping concentration and profile under gate region A is designed for best performance of the short channel floating body device. The resistance under gate region B (140) is referred to the extrinsic part (Rbext) because the resistance is independent of the channel length and width. For a typical mid-UV lithography process, the extended region 140 is approximately of the order of 0.5 $\mu$m to 1 $\mu$m wide. Under the extended gate region (140), there is only 'well' doping (i.e., the implantation before the gate formation) which is used to adjust the threshold voltage of the MOSFET. In addition to well doping, 'halo' doping is implanted at a large angle after the gate formation to adjust the threshold voltage of a short channel device and obtain a better short-channel effect control. The halo doping also enters the region from the upper edge of the extended gate. Since the implant angle is usually less than 40 degrees, the doping usually does not encroach excessively (less than 0.1 $\mu$m). Therefore, the halo contribution to Rbext is small.

Reducing the SOI film increases both Rbint and Rbext, the resulting resistance being strongly dependent on the halo and well doping. Since both of these doping are used to adjust the threshold voltage of the short channel device, various situations may be possible: either the halo is strong and the well is weak, or the halo is weak and the well is strong, or they may take any intermediate values in between. A strong halo and a weak well design is commonly used to provide better short channel effect control. In this case, the extrinsic body resistance (Rbext) is the most prevalent. If no special measures are taken, the high Rbext becomes a real obstacle to using a strong halo and a weak well design in the presence of very thin SOI films. This invention solves this problem by incorporating an additional implant.

OBJECTS OF THE INVENTION

Accordingly, it is an object of the invention to reduce the extrinsic body resistance in SOI CMOS devices when migrating to thinner SOI films by incorporating an additional implant to the process.

It is another object to achieve a low body resistance in SOI CMOS technology to avoid floating body effect when using body contacted MOSFET (BC-MOSFET).

It is yet another object to resolve the problem of body resistance in SOI film thinner than 100 nm without complicating the manufacturing process.

SUMMARY OF THE INVENTION

As the SOI CMOS technology continues migrating towards thinner SOI thicknesses to reduce the parasitic capacitance and improve the short channel effects, it is known that the body resistance of body contacted MOSFETs increases correspondingly. The problem is compounded for strong halo and weak wells device designs for T-shaped or L-shaped BC-MOSFETs. This effect is present because the extended gate region has a longer channel length, thus receiving a weak well doping. The combination of the weak well and thin SOI make the region easily fully depleted which, in turn, increases the extrinsic body resistance that becomes very high.

In a first aspect of the invention, there is provided a structure and a method that includes an additional well level implant for n-type and p-type devices in selected parts of the extended gate region.

A new mask increases the channel doping at the extended gate region to prevent that region from fully depleting and increasing the carrier concentration for lower resistance. Since the physical gate dimensions are usually narrower than the mask dimensions, the mask is slightly offset from the extended gate edge to avoid excessive encroachment into the intrinsic device channel region.

In one form of the invention, there is provided a silicon-on-insulator field effect transistor (SOI FET) device having a body contact that includes: a pattern provided with a first extended region to form a gate for the SOI FET, and a second extended region to isolate the body contact region from the SOI FET; a first sub-region under the first extended region having added doping to adjust the threshold voltage of the SOI FET, the first sub-region defining a gate width of the SOI FET; a second sub-region under the second extended region and an adjoining portion of the first extended gate region to form a low resistance extrinsic body contact region; source and drain regions respectively positioned at each side of the first extended region; and a body contact region adjacent to the second extended region opposite to the SOI FET.

In a second aspect of the invention, there is provided a method of forming a silicon-on-insulator field effect transistor (SOI FET) device having a body contact that includes the steps of: implanting SOI islands with p-type doping for an n-type SOI FET to adjust the threshold voltage; implanting additional p-type doping in a region integral to each of the SOI islands to define a p+ extrinsic body region and a p-type channel region; growing a gate oxide layer on each of the SOI islands; depositing polysilicon on the gate oxide layer; defining a polysilicon gate region covering the p-type channel region and partially covering the p+ extrinsic body region; adding spacers at edges of the polysilicon gate; implanting added n-type doping to a portion of the polysilicon gate to form an n++ gate region covering the p-type channel region and partially covering the p+ extrinsic body region; implanting added p-type doping to a portion of the polysilicon gate to form an p++ gate sub-region not extending into the channel region, and a second p++ gate sub-region on an exposed surface of the SOI islands; and siliciding exposed polysilicon gate regions and exposed SOI regions.

BRIEF DESCRIPTION OF THE DRAWINGS

These and other objects, advantages and aspects of the invention will be better understood by the following detailed description of a preferred embodiment when taken in conjunction with the accompanying drawings.

DETAILED DESCRIPTION OF THE INVENTION

The invention will now be described first by way of the design layout and then by a description of the process sequence.

Figure 1:
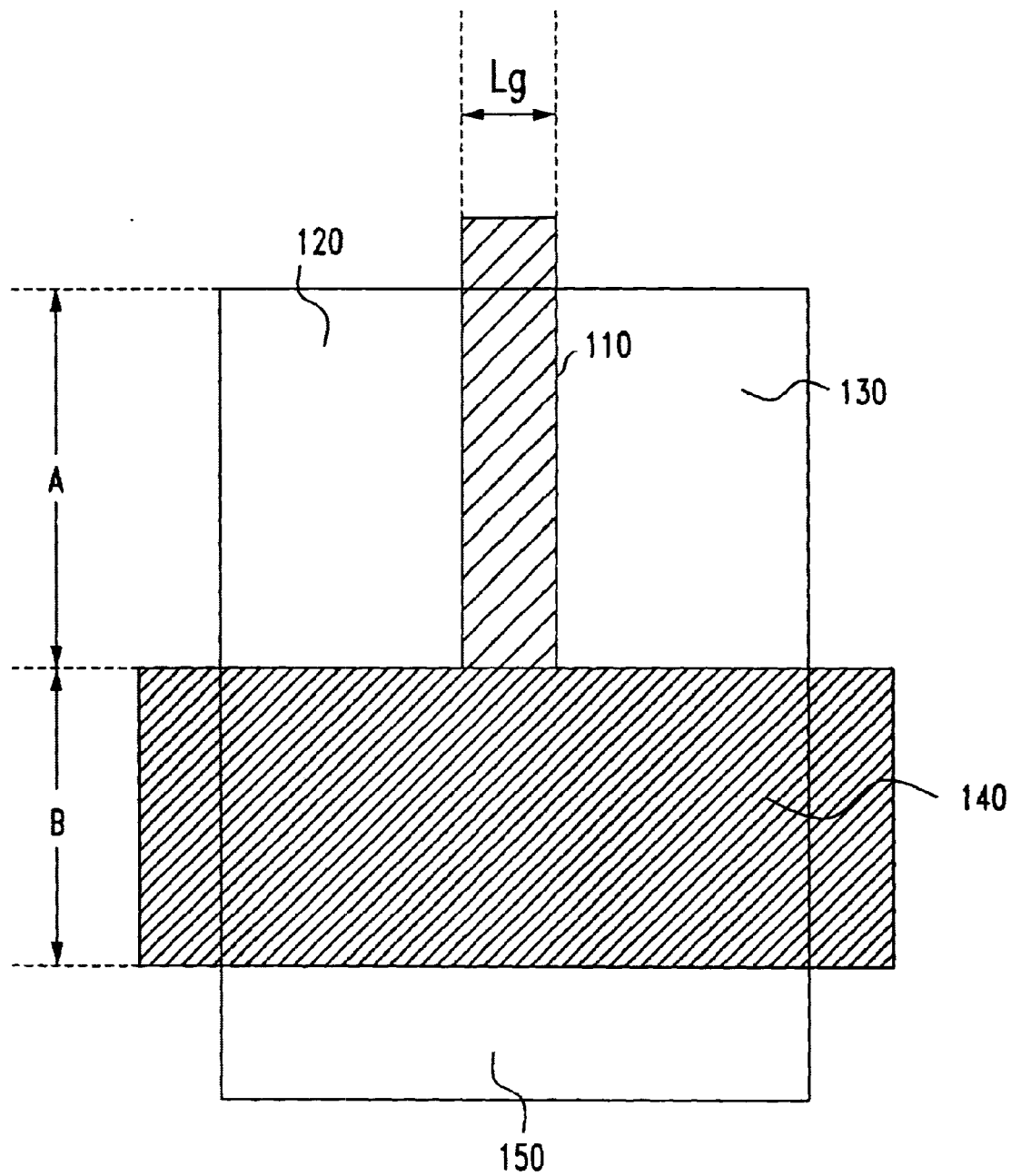
FIG. 1 shows the layout of a prior art T-shaped body contact MOSFET.
Figure 2:
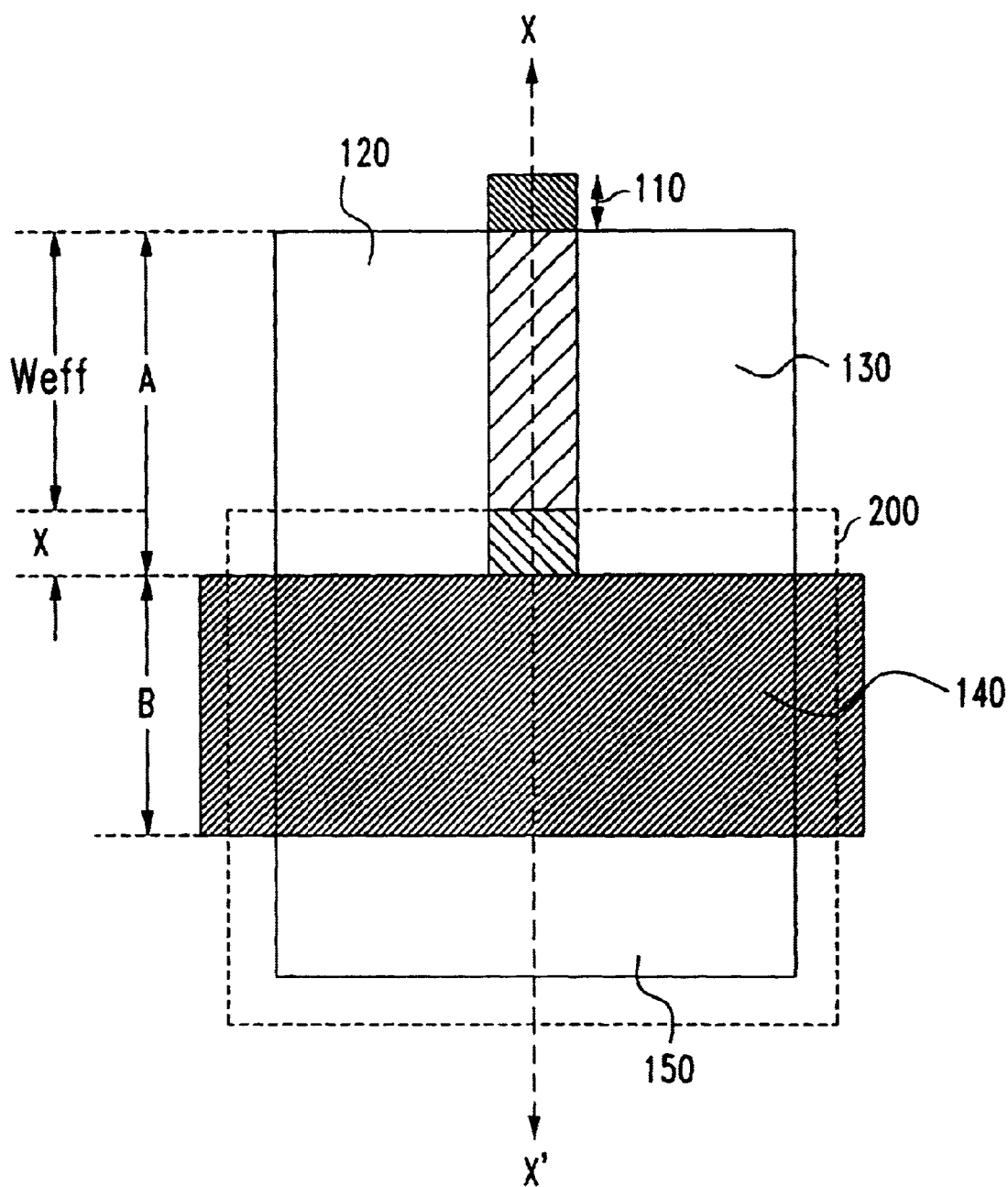
FIG. 2 shows the layout of a T-shaped body contact MOSFET having a region provided with added doping, in accordance with the present invention.

FIG. 2 shows the layout of the design of a T-shaped body contact MOSFET, in accordance with the present invention, wherein extra doping has been added. An additional well doping mask 200 overlapping region 140 is inserted therein. The mask 200 should preferably cover the entire extended gate region 140. However, the mask should not stretch too much beyond region 140 because it reduces the effective channel width of the device. This point will be discussed hereinafter in more detail. The added mask allows for additional well doping into the channel under the extended gate region 140. The dose of the well doping can be adjusted to obtain the expected extrinsic body resistance. Usually, the extrinsic body resistance is expected to be much smaller than the intrinsic resistance. Thus, the dose of the additional well doping should be higher than the well doping and even higher than the halo doping. However, if the doping is too elevated, it can induce significant parasitic junction capacitance and degrade the device performance. This doping is p-type for an NMOSFET and n-type for a PMOSFET. The added mask 200 is aligned with reference to the top edge of the extended gate with a distance X. The distance X provides a certain level of tolerance to account for process variation and misalignment, and ensures that the additional doping resides within the extended gate. The distance X can be positive or negative (i.e., within the extended gate) depending on the exact process used. In some actual processes, the gate length is usually trimmed to be much shorter than the layout dimension. Therefore, in the layout, even if the mask 200 is just on top of the extended gate 140, the implant will certainly cover the physical extended gate area. Thus, the distance X needs to be adjusted accordingly to match the exact gate trim process. What matters is that the overlap between additional doping and the channel length (region A) be minimized. Excessive overlap can increase the threshold voltage locally at the high doping region. The high threshold voltage lowers the current drive in that region and effectively reduces the channel width (Weff) of the device. The doping of the additional well doping should be chosen to optimize the extrinsic body resistance. While higher doping concentration always reduces Rbext, it also increases the parasitic junction capacitance at the edge of extended gate region. Thus, it is advantageous to make the doping sufficiently high such that the extrinsic body resistance is significantly smaller than the intrinsic body resistance.

Figure 3:
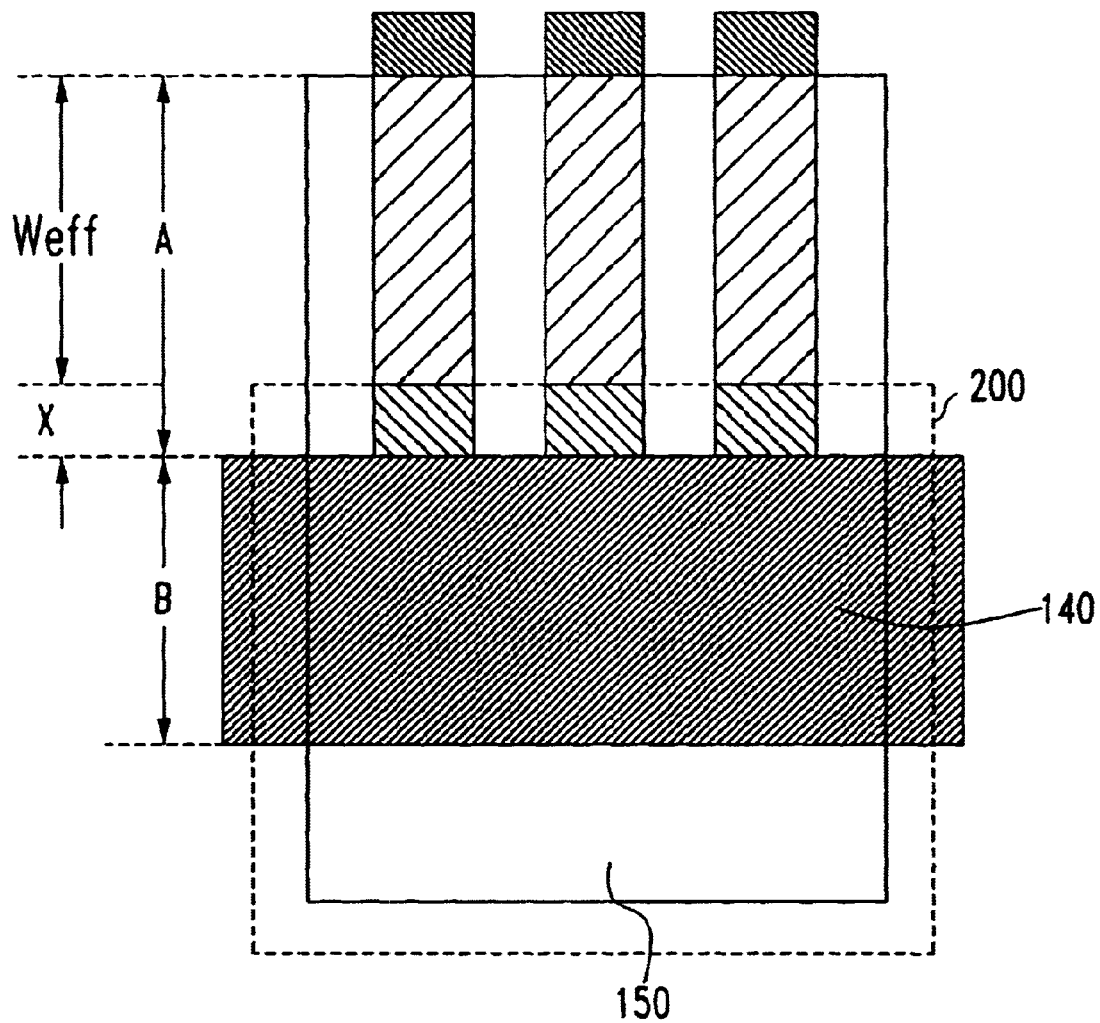
FIG. 3 shows the layout of a multi-finger T-shaped body contact MOSFET with a region of high doping, according to the present invention.

By incorporating the aforementioned added doping, the device design of the well doping can be chosen freely without having to be concerned with the extrinsic body resistance. This additional doping can also be applied to a multifinger BC-MOSFET, as shown in FIG. 3. The extended gate is elongated to accommodate more fingers, in the present case, three fingers in total. For each finger, the effective width is defined by the isolation edge to the edge of the additional well doping 200. The additional mask 200 is elongated accordingly to cover all the fingers.

A process sequence to achieve the structure of the present invention will now be described, and more particularly, at a cross-section cutting the device at lines X–X' (see FIG. 2). An NMOSFET is selected to illustrate the structure of interest.

Figure 4:
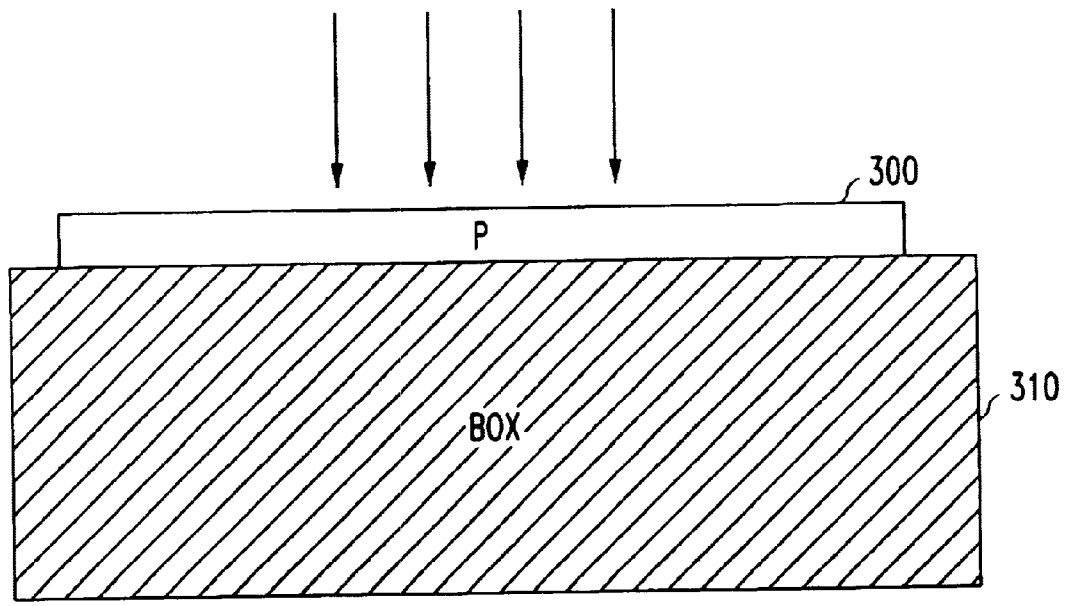
FIG. 4 shows a side view of a cross-section taken at lines X–X' (FIG. 2) of a thin SOI film after applying the p-type well doping to adjust the threshold voltage.
Figure 5:
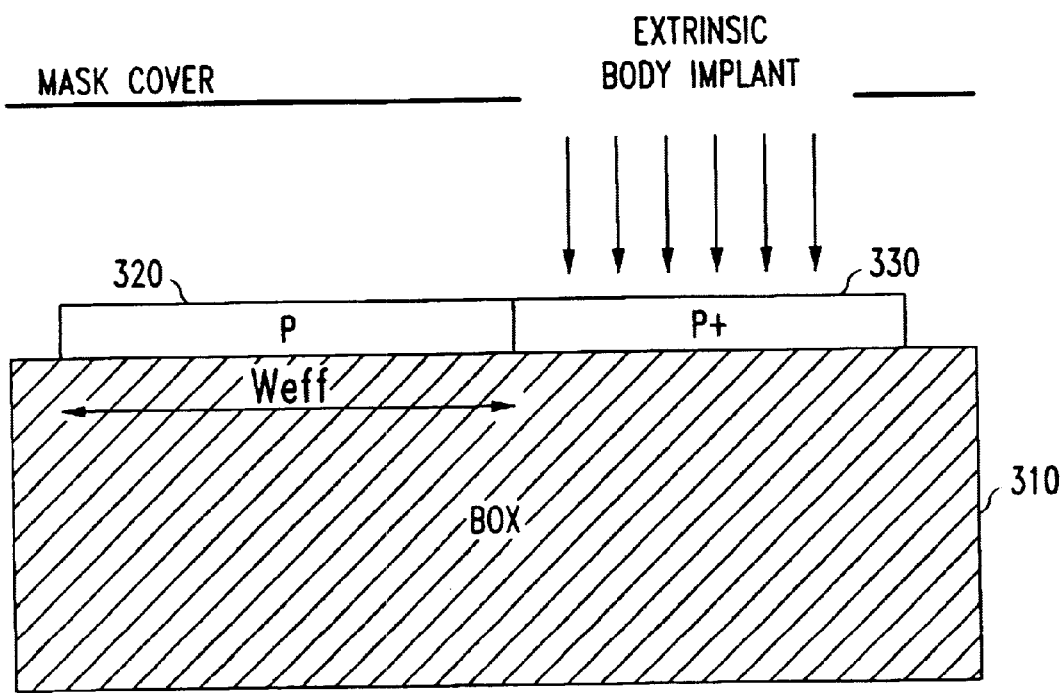
FIG. 5 shows the same structure after adding the supplemental p-type welldoping.

Following the SOI isolation process, a p-type well doping is carried out for threshold voltage adjustment (FIG. 4). An SOI layer (300) is positioned on top of the buried oxide (310). The extrinsic body doping (P+) is performed before or after the first well doping (FIG. 5). As previously mentioned, the distance from the P+ doping region to the other silicon edge becomes the effective channel width Weff (FIG. 2). The lighter doped p region (320) forms the channel region while the higher p+ doping region becomes the body contact region at a later process step.

Figure 6:
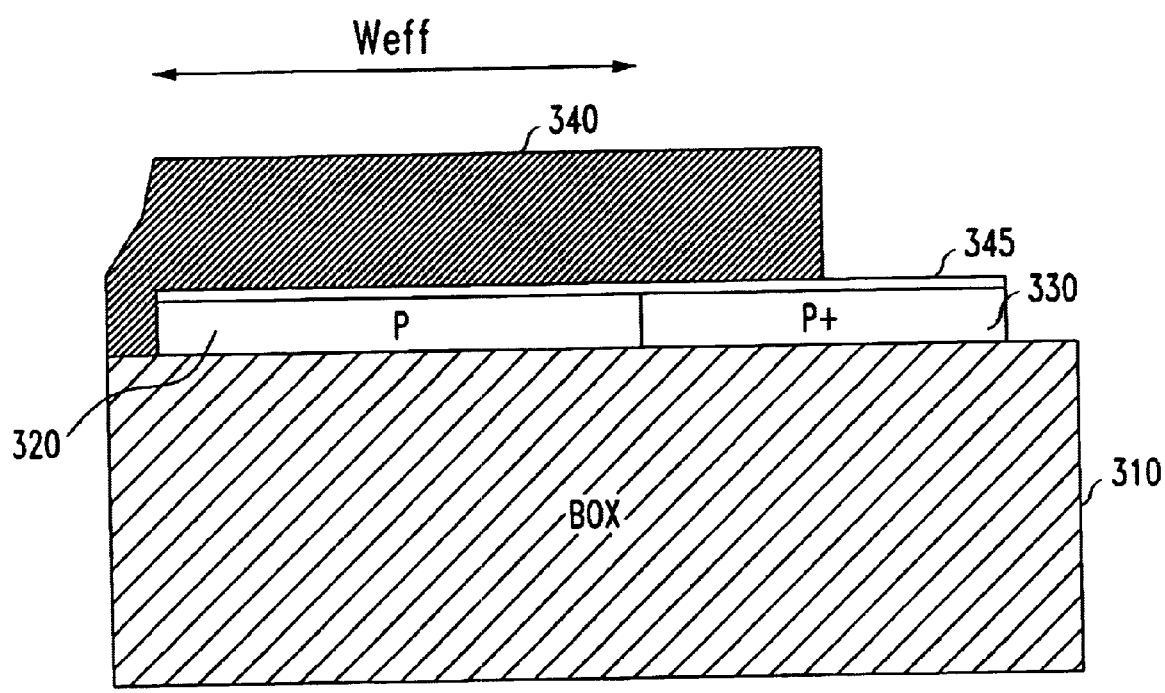
FIG. 6 shows the previous structure after gate oxide and gate stack formation.

Referring to FIG. 6, a gate oxide layer (345) is grown on top of the SOI layer (300) to form the gate dielectric. Then, the gate material is deposited and a pattern is formed to provide a gate electrode (340). The gate electrode should, advantageously, cover the boundary of the P and P+ region, in accordance with the layout shown in FIG. 2.

Figure 7:
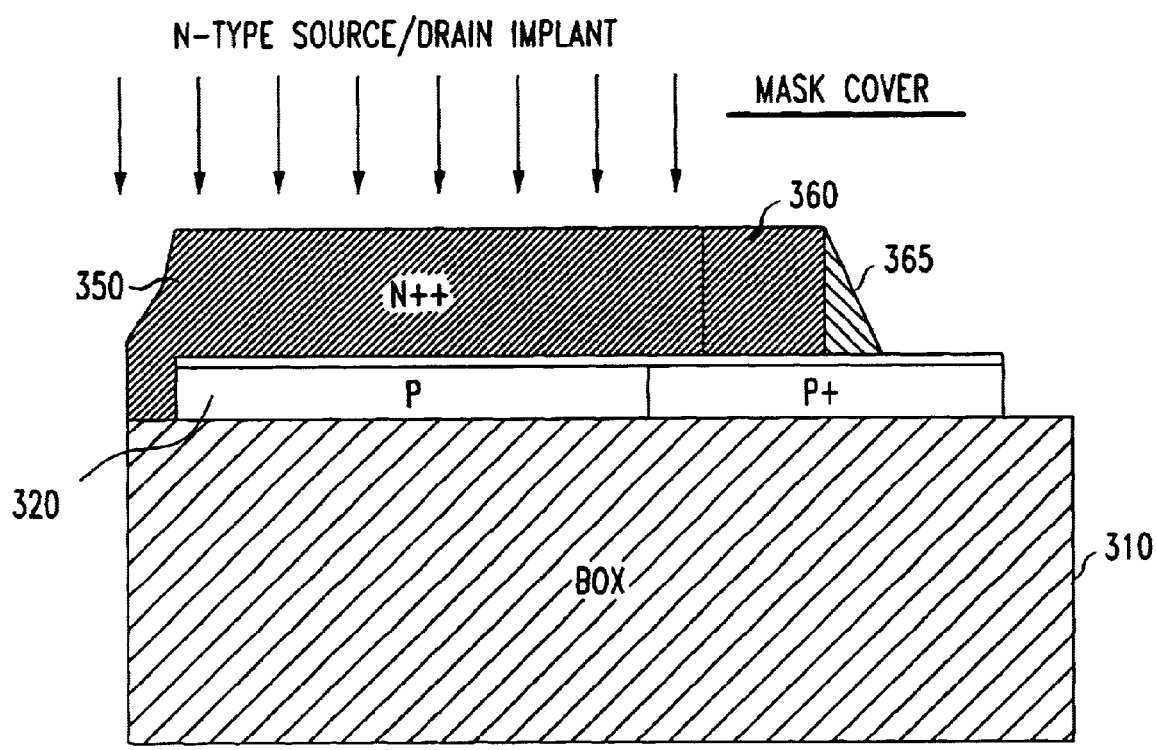
FIG. 7 shows the previous structure after applying the n-type source-drain doping.
Figure 8:
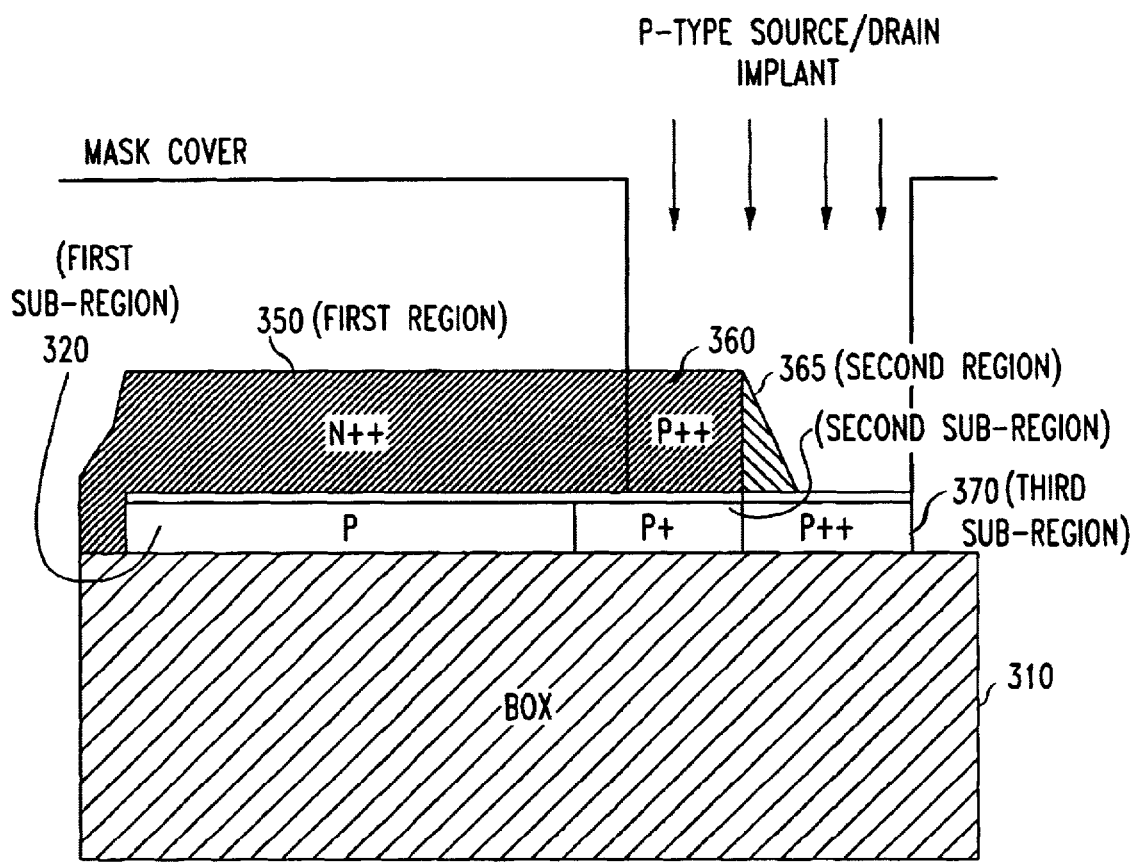
FIG. 8 shows the previous structure after applying the p-type source-drain doping.
Figure 9:
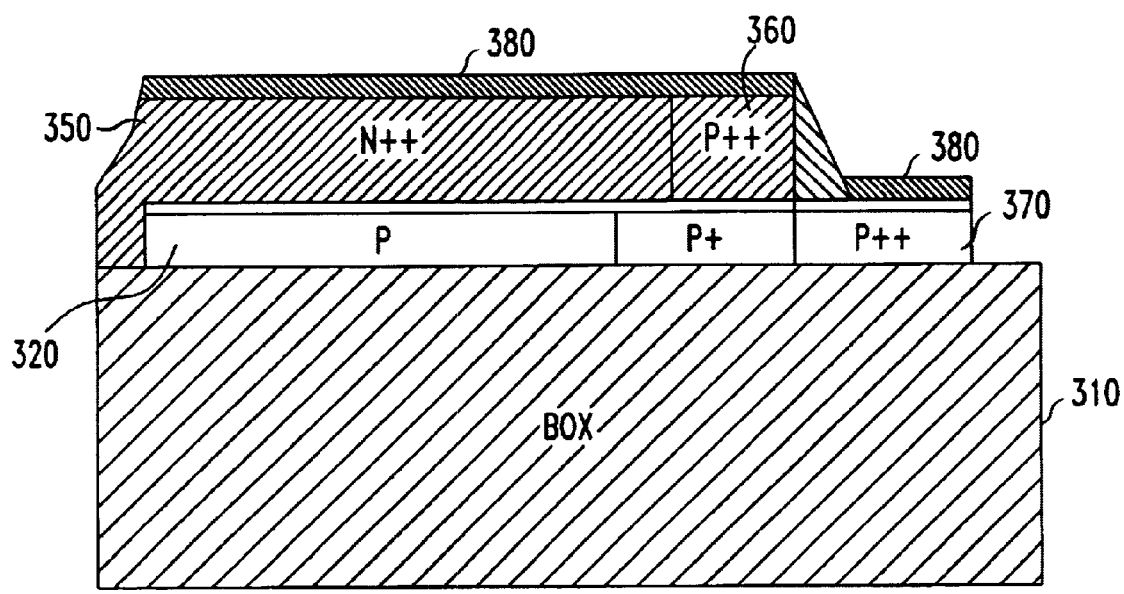
FIG. 9 shows the previous structure after the formation of the self-aligned silicide.

Referring now to FIG. 7, formation of a spacer (360) follows next. A heavily n-type doping (N++) region is formed on the source and drain (120 and 130 in FIG. 2), as well as a polysilicon region (350). Part of the poly (360) is left undoped. Referring to FIG. 8, another heavily p-type doping (P++) is formed on the body contact region (370), as well as on the polysilicon region (360). Lastly, silicide (380) is formed on the silicon and polysilicon gate in a self-aligned fashion. (FIG. 9). The silicide connects the N++ polysilicon (350) (first region) to the P++ polysilicon (360) (second region), which are characterized by their low resistance. Thus, as shown in the drawing, there exists now a high doping path extending from the P channel (320) (first sub-region), through a P+ (second sub-region), and finally to the P++ body contact area (370) (third sub-region). Since the resistance is inversely proportional to the doping concentration, the extrinsic body resistance from the body contact area (370) to the channel (320) is very low.

As the silicon film thickness is reduced, the additional well doping should increase accordingly to keep the resistance low, a distinct advantage of the present structure. A low extrinsic body resistance is certainly possible for SOI film thickness down to 50 nm, and even down to 30 nm.

While the invention has been described in conjunction with a specific best mode, it is understood that many alternatives, modifications and variations will be apparent to those skilled in the art in light of the aforementioned description. Accordingly, it is intended to embrace all such alternatives, modifications and variations which fall within the scope of the appended claims. All matters set forth herein or shown in the accompanying drawings are to be interpreted in an illustrative and non-limiting sense.

What is claimed is:

1. A silicon-on-insulator field effect transistor (SOI FET) device having a body contact comprising:
    a pattern provided with a first coplanar to a second region, said first region forming a gate for said SOIFET, and said second region placed between the body contact and said first region;
    a first sub-region underneath said first region forming a channel, said first sub-region for adjusting the threshold voltage of said SOI FET;
    a second sub-region adjacent to said first sub-region, and a third sub-region contiguous to said second sub-region, said second sub-region placed under said second region and under a contiguous portion of said first region being provided with a first doping concentration, said second sub-region forming a low resistance extrinsic body contact region, said third sub-region having a second doping concentration, and forming the body contact region,
    said second region and said third sub-region having a second doping concentration which is higher than said first doping concentration in said second sub-region; and
    source and drain regions positioned on each side of said first sub-region.

2. The silicon-on-insulator FET device as recited in claim 1, wherein said second sub-region is provided with multiple fingers extending orthogonally to said third sub-region.

3. The silicon-on-insulator FET device as recited in claim 1, wherein said second region is provided with a spacer at an end thereof, said spacer isolating the junction separating said second region and said third sub-region.

4. The silicon-on-insulator FET device as recited in claim 1, wherein the width of said first sub-region is adjusted to minimize the threshold voltage that lowers the current drive in said first sub-region, thereby reducing the effective width of said channel (Weff).

5. The silicon-on-insulator FET device as recited in claim 1, wherein said second doping concentration determines the desired extrinsic body resistance.

6. The silicon-on-insulator FET device as recited in claim 1, wherein the doping concentration in said second sub-region exceeds the doping concentration within a well or a halo.

7. The silicon-on-insulator FET device as recited in claim 1, wherein said doping is a p-type doping for an NFET device and an n-type doping for a PFET device.

8. The silicon-on-insulator FET device as recited in claim 1, wherein said first doping concentration reduces the extrinsic body resistance to a value that is lower than the intrinsic body resistance.

9. The silicon-on-insulator FET device as recited in claim 1, wherein said FET device is provided with a T-shaped body contact.

10. The silicon-on-insulator FET device as recited in claim 1 further comprising a gate oxide layer on said first sub-region underneath said first region, and said second and a third sub-regions.

11. The silicon-on-insulator FET device as recited in claim 1 further comprising a suicide layer covering said first and second regions and the exposed area of said body contact region.

* * * * *